United States Patent

Hara

[11] Patent Number: 5,881,987
[45] Date of Patent: Mar. 16, 1999

[54] VIBRATION DAMPING APPARATUS

[75] Inventor: Hiromichi Hara, Utsunomiya, Japan

[73] Assignee: Canon Kabushiki Kaisha, Tokyo, Japan

[21] Appl. No.: 831,760

[22] Filed: Apr. 1, 1997

[30] Foreign Application Priority Data

Apr. 2, 1996 [JP] Japan ................................. 8-102035

[51] Int. Cl.⁶ ............................ F16M 13/00; F16M 1/00; G03B 27/42; G03B 27/58
[52] U.S. Cl. ............................ 248/550; 248/550; 355/53; 355/72; 267/136
[58] Field of Search .................................... 248/550, 560, 248/566, 618, 637, 638, 346.01, 346.05; 267/136; 355/53

[56] References Cited

U.S. PATENT DOCUMENTS

| | | | |
|---|---|---|---|
| 3,281,101 | 10/1966 | May | 248/550 |
| 4,336,917 | 6/1982 | Philips | 248/550 |
| 4,477,045 | 10/1984 | Karasawa et al. | 248/550 |
| 4,803,712 | 2/1989 | Kembo et al. | 378/34 |
| 4,927,119 | 5/1990 | Frost | 248/550 |
| 4,976,415 | 12/1990 | Murai et al. | 248/550 |
| 5,038,835 | 8/1991 | Breyer | 248/550 |
| 5,042,784 | 8/1991 | Murai et al. | 248/550 |
| 5,121,898 | 6/1992 | Yasuda et al. | 248/550 |
| 5,141,201 | 8/1992 | Mizuno et al. | 248/550 |
| 5,187,519 | 2/1993 | Takabayashi et al. | 355/53 |
| 5,356,110 | 10/1994 | Eddy | 248/550 |
| 5,478,043 | 12/1995 | Wakui | 248/550 |
| 5,610,686 | 3/1997 | Osanai | 355/72 |

FOREIGN PATENT DOCUMENTS 3643-701-A 12/1986 Germany ............................... 248/550

*Primary Examiner*—Leslie A. Braun
*Assistant Examiner*—Michael D. Nornberg
*Attorney, Agent, or Firm*—Fitzpatrick, Cella, Harper & Scinto

[57] ABSTRACT

An air-pressure vibration-damping apparatus, supporting an upper apparatus between a mounting floor and the upper apparatus. The vibration damping apparatus has four or more air springs for supporting the upper apparatus, a vibration-damping controller for controlling inner air pressures of the air springs so as to damp vibration from the mounting floor to the upper apparatus and suppress vibration of the upper apparatus, and a communicating pipe passing air between at least one couple of the air springs. When the couple of air springs mutually connected via the communicating pipe are regarded as one air spring, the number of air springs is three. Regarding this couple of air springs, the vibration-damping controller controls air pressure of at least one air spring.

14 Claims, 3 Drawing Sheets

VIBRATION DAMPING APPARATUS

BACKGROUND OF THE INVENTION

This invention relates to an air-pressure vibration damping apparatus, and an exposure apparatus and a device manufacturing method using the vibration damping apparatus. The vibration damping apparatus is placed on a mounting floor, supporting an upper apparatus such as an exposure apparatus by using air springs, damps vibration from the mounting floor to the upper apparatus, and suppresses vibration of the upper apparatus, by controlling the inner air pressures of the air springs. The air springs generally function as actuators for positioning the absolute or relative position of the upper apparatus with respect to the setting surface.

In recent years, semiconductor devices are manufactured by using a so-called "stepper" exposure apparatus. That is, the device is sequentially positioned at a desired position on a sensitized substrate (a wafer or a glass substrate on which a photoresist layer is provided) on which a reticle pattern image is projected via a projection optical system. The sensitized substrate is held on X- and Y-stages, and the positioned device is exposed there. Especially, in this manufacturing method, high-density semiconductors are made. Therefore, it is necessary to transfer a finer pattern on the exposure substrate.

In this situation, the level of a vibration damping technique for the exposure apparatus must be increased, and various vibration damping apparatuses are known for the purpose of preventing vibration from the mounting floor to the exposure apparatus.

Conventionally, a passive vibration-damping apparatus using mechanical springs and dash pots is widely employed. This apparatus damps vibration from a mounting floor by reducing the spring constant to lower the resonance frequency of the vibration system, and widening the vibration-damping area, thus suppressing vibration transmittance to a low level. Further, with respect to vibration which occurs on an exposure apparatus caused by step motions of the X- and Y- stages and the like, the apparatus absorbs vibration energy by increasing the damping rate of the dash pots, thus suppressing vibration quickly.

Recently, as the vibration damping apparatus, an active or semiactive vibration-damping apparatus which actively controls an object apparatus, is becoming popular. The active vibration-damping apparatus has sensors for detecting vibration of the object apparatus, e.g., an exposure apparatus, and the relative position of the exposure apparatus with respect to a mounting floor. Based on detection signals from the sensors, energy from actuators of the vibration damping apparatus is applied to the exposure apparatus, to positively enhance damping of vibration from the mounting floor to the exposure apparatus and vibration which occurs on the exposure apparatus by step motions of the X- and Y- stages.

The actuators used in the active vibration-damping apparatus are briefly divided into electric actuators and air actuators. Air-pressure active vibration-damping apparatuses have three or more air springs for supporting an exposure apparatus in the vertical direction. The respective air springs have inner air pressures at an equilibrium. The air springs generate counter forces to support the exposure apparatus. On the exposure apparatus, the step motions of the X- and Y- stages are regularly made upon each exposure. The moving load tilts the exposure apparatus, which changes the relative position of the exposure apparatus with respect to the mounting floor. The posture of the exposure apparatus is detected by sensors, mounted on the active vibration-damping apparatus, for monitoring the relative position of the exposure apparatus with respect to the mounting floor. In accordance with detection signals from the sensor, servo valves, electromagnetic valves and the like, as electricity/air-pressure converters are opened/closed by a controller, to provide/release air to/from the respective air springs, thus control the inner air pressures of the air springs. The exposure apparatus is returned by the air springs to restore the initial relative position with respect to the mounting floor with high precision. At the same time, based on detection signals from sensors monitoring vibration of the exposure apparatus, the electricity/air-pressure converters are opened/closed to change the inner air pressures of the air springs, to generate position-corrected forces to the springs to damp vibration. This damps resonance vibration of a vibration system of the exposure apparatus, and obtains a high vibration-damping effect. As a result, the exposure apparatus can be isolated from vibration of the mounting floor, and the vibration of the exposure apparatus can be quickly suppressed.

A semiconductor device is manufactured by overlaying a number of layers of circuit patterns on a sensitized substrate. In the exposure apparatus, to transfer a second or subsequent circuit pattern on the sensitized substrate, relative positioning (alignment) between the prior circuit pattern formed on the sensitized substrate and a reticle to be projected is required. The conventional active vibration-damping apparatus has been effective by virtue of its vibration damping of the exposure apparatus, however, it has the following problems for high precision alignment corresponding to high-density semiconductor devices.

In the conventional active vibration-damping apparatus, at each step motion of the X- and Y- stages, the inner air pressures of the plural air springs are controlled so as to maintain the posture of the exposure apparatus where the center of gravity has changed. Accordingly, the balance of the supporting counter forces generated by the respective air springs changes at each step motion, which deforms the exposure apparatus in a nano-order. This deformation affects the positioning of the reticle pattern and sensitized substrate, and disturbs the relative position among aligning units such as the projection optical system, an alignment scope and the like, mounted on the exposure apparatus.

To manufacture high-density semiconductor devices, the change of supporting counter forces of the air springs due to the step motions of the X- and Y- stages must be suppressed to a low level, and the supporting counter forces must be obtained in accordance with the positions of the X- and Y- stages. This reduces the change of relative positions of the aligning units mounted on the exposure apparatus, and upon transferring a second or subsequent layer of a circuit pattern, restores the relative positions when the prior layer of the circuit pattern has been transferred. As a result, aligning ability can be improved.

However, in a case when the conventional active vibration-damping apparatus has four or more air springs, it is very difficult to restore the supporting counter forces in accordance with the position of the X- and Y- stages. Since a plane is defined by three points, four or more supporting point(s) causes an unstable support which disturbs the plane. Accordingly, if a number of layers of circuit patterns are overlaid, the equilibrium of the inner air pressures of the four or more air springs when exposing the first layer cannot be restored exactly to for exposure of the second layer. In this case, the equilibrium of the inner pressure the air springs changes by a large amount, and the inner pressures greatly change. This degrades the aligning performance of the vibration damping apparatus.

On the other hand, in a case when the active vibration-damping apparatus has three air springs, the equilibrium of the inner air pressures of the respective air springs, determined upon step motions of the X- and Y- stages on the exposure apparatus, can be fixed depending upon the position of the stepped X- and Y- stages. However, the number of supporting points for the exposure apparatus is limited to three, and this narrows the freedom of designing the vibration damping apparatus.

SUMMARY OF THE INVENTION

The present invention has been made in consideration of the above situation, and has as its object to provide an active air-pressure vibration-damping apparatus and method which supports an upper apparatus such as an exposure apparatus with four or more air springs, damps vibration from a mounting floor to the upper apparatus, quickly suppresses vibration of the upper apparatus due to step counter forces upon X- and Y- stages and the like, and restores the relative position of the upper apparatus with respect to the mounting floor with high precision, thus enabling static-deformation control of a device by restoring the equilibrium of the inner air pressure of the air springs in accordance with the stepped positions of the X- and Y- stages, with high precision.

Further, another object of the present invention is to provide a vibration damping apparatus which effectively damps vibration of an upper apparatus with four or more air springs, and when the upper apparatus is in a static status, supports the upper apparatus as if it uses three of the air springs, thus preventing deformation of the upper apparatus.

Further, another object of the present invention is to provide an exposure apparatus having a vibration damping apparatus as above, to enable exposure processing for a plurality of layers of patterns with high precision.

Further, another object of the present invention is to provide a device manufacturing method appropriate for exposure processing of a semiconductor device and the like manufactured by transferring a number of layers of circuit patterns.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

Figure 1:
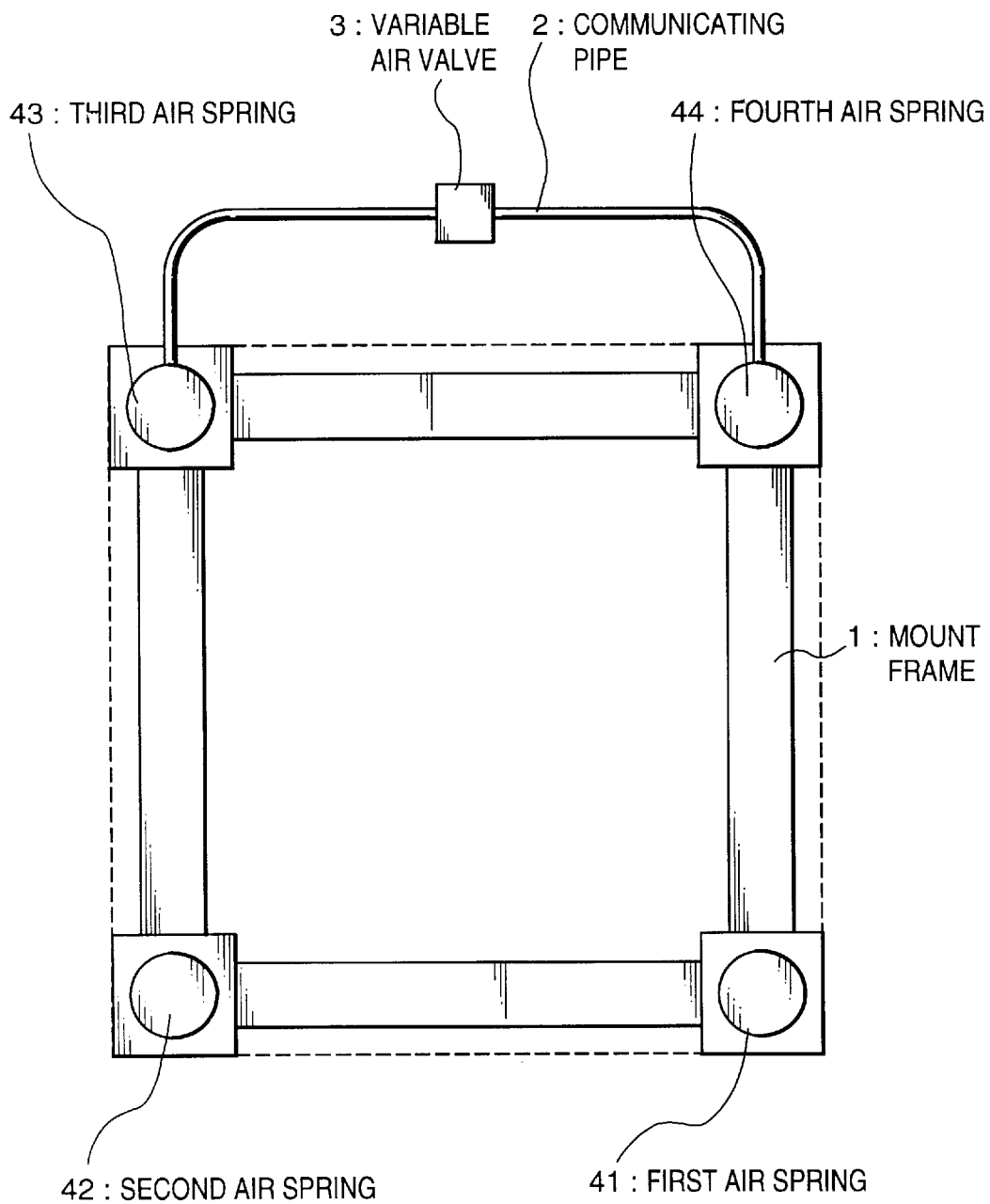
FIG. 1 is a plan view showing the arrangement of actuators of an active vibration-damping apparatus according to an embodiment of the present invention.

A preferred embodiment of the present invention will now be described in detail in accordance with the accompanying drawings.

According to one aspect of the present invention, an air-pressure vibration-damping apparatus, placed on a mounting floor, comprises four or more air springs supporting an upper apparatus, an air-pressure control mechanism for controlling the inner air pressures of the air springs so as to damp vibration from the mounting floor to the upper apparatus and suppress vibration of the upper apparatus, and a communicating pipe passing air between two of the air springs.

Preferably, the communicating pipe has a mechanism for increasing/decreasing the effective cross section of the pipe. Further, the air-pressure control mechanism has monitoring mechanisms for monitoring, e.g., displacement, speed and acceleration of the upper apparatus or inner air pressures of the air springs, electric air-pressure converting mechanisms for controlling the inner air pressures of the air springs, and a controller for drive-controlling the electric air-pressure converting mechanisms in accordance with output signals from the monitoring mechanisms.

Further, it is preferable that if the two springs coupled by the communicating pipe are regarded as one air spring, the number of air springs is three. In this case, the inner air pressures of the coupled air springs become the same immediately after each step motion of the X- and Y-stages. That is, an active vibration-damping apparatus having a pseudo-tripodal structure is realized. This structure can restore the equilibrium of the inner air pressures of the air springs in accordance with stepped positions of the X- and Y-stages, with high precision. With regard to the coupled air springs, the air-pressure control mechanism controls the inner air pressure of at least one of the springs.

Further, according to another aspect of the present invention, an exposure apparatus supported by the above air-pressure vibration-damping apparatus is provided. The exposure apparatus performs projection-exposure on a reticle pattern on a sensitized substrate via a projection optical system by a step-and-repeat method.

Further, according to another aspect of the present invention, a device manufacturing method using the air-pressure vibration-damping apparatus is provided. This method manufactures a device such as a semiconductor device, by supporting the exposure apparatus on a mounting floor with four or more air springs, damping vibration from the mounting floor to the exposure apparatus while suppressing vibration of the exposure apparatus by controlling the inner air pressures of the air springs, and projection-exposing a reticle pattern on the sensitized substrate via the projection optical system by the step-and-repeat method. When the inner air pressures of two air springs, coupled by the communicating pipe, are different from each other, the difference of the air pressures is dissolved by passing air through the communicating pipe.

If the exposure apparatus supported by the air-pressure vibration-damping apparatus stays at a static reference position with respect to a mounting floor, when the X- and Y-stages on the exposure apparatus make step motions, the air spring on the step-moved side, i.e., the side to which the X- and Y-stages have moved, sink due to the moving load. The relative position of the exposure apparatus with respect to the mounting floor is detected by sensors, and in accordance with signals from the sensors, the electric air-pressure converting mechanism operates to introduce air into the compressed spring so as to increase the inner air pressure and restore the initial position of the apparatus. On the other hand, the air spring on the side opposite to the step-moved position rises for the moving load. The change of the relative position of the exposure apparatus with respect to the mounting floor corresponding to the rise of the spring is detected by the sensors, and in accordance with signals form the sensors, the electric air-pressure converting mechanisms exhaust air so as to decrease the inner air pressure of the expanded spring and restore the initial position of the apparatus. As the positioning of the X- and Y-stages has been completed and the exposure apparatus returns to the static reference position, the inner pressures of connected air tanks become the same, and the inner air pressures of the respective air springs are at an equilibrium. Thus, the equilibrium of the inner air pressures of the air springs can be restored with high precision in accordance with stepped positions of the X- and Y-stages.

Figure 2:
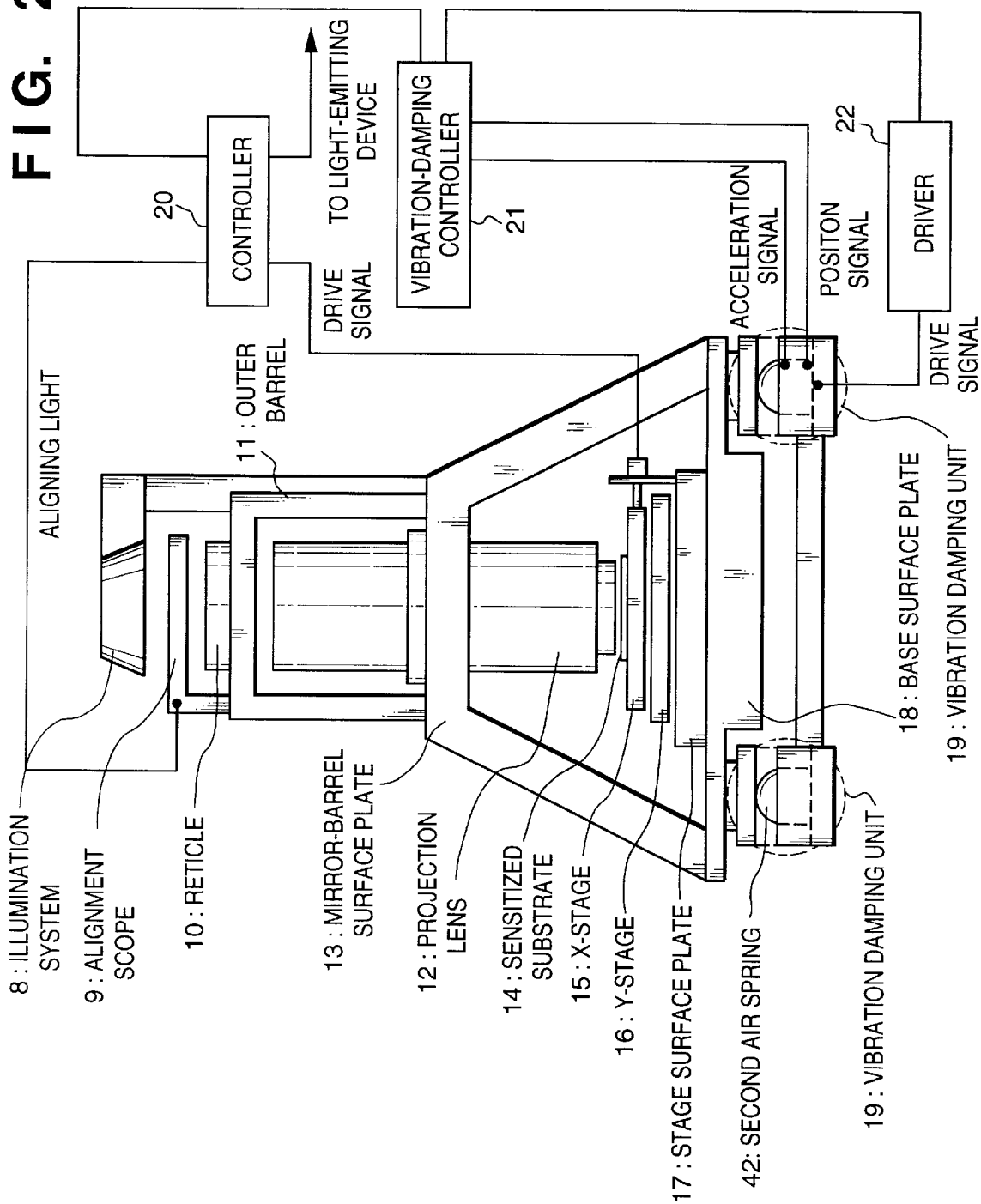
FIG. 2 is a cross-sectional view showing the structure of an exposure apparatus having the active vibration-damping apparatus in FIG. 1.
Figure 3:
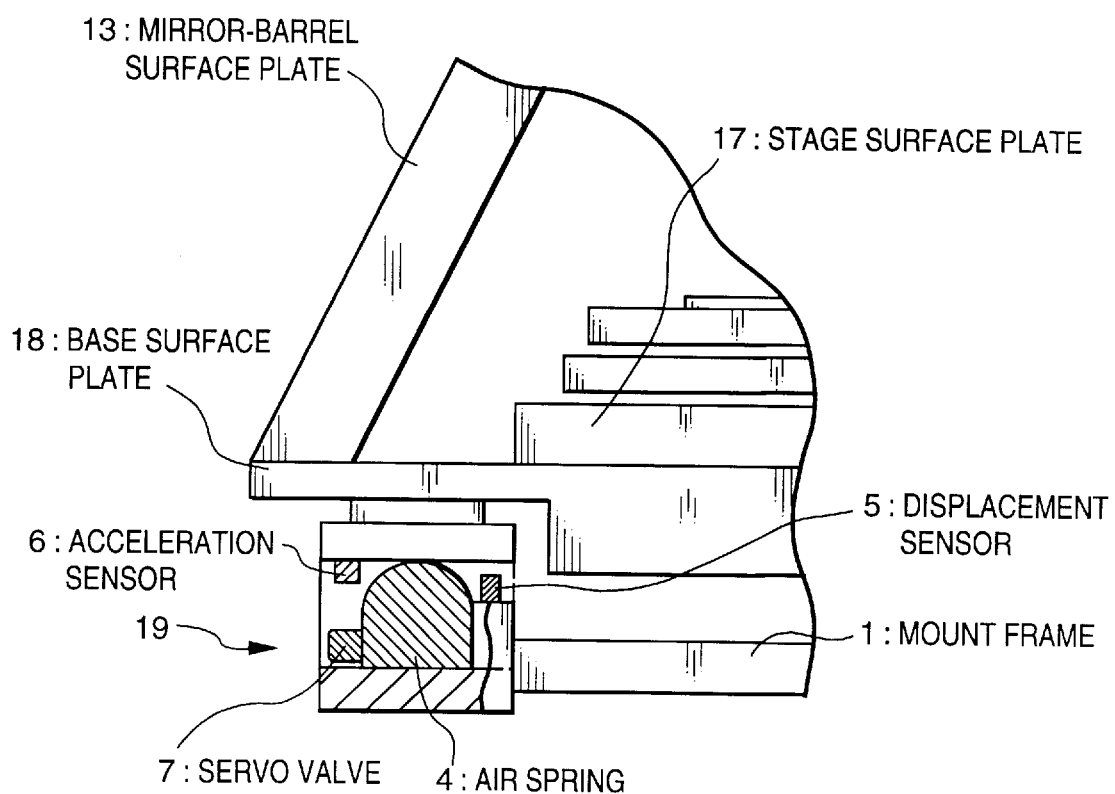
FIG. 3 is an enlarged partial cutaway view showing the detailed structure of the active vibration-damping apparatus in FIG. 1.

FIG. 2 is a view showing the basic structure of an exposure apparatus supported by the vibration damping apparatus according to an embodiment of the present invention. FIG. 3 is an enlarged partial cutaway view showing the detailed structure of the active vibration-damping apparatus. FIG. 1 is a view showing the arrangement of actuators of an active vibration-damping apparatus according to an embodiment of the present invention.

In FIG. 2, reference numeral 8 denotes an illumination system which guides a laser beam introduced from a light-introduction unit (laser-light introduction unit) onto a reticle; 9, an alignment scope which detects the position of the reticle with respect to a reticle reference mark and detects the position of a sensitized substrate with respect to the reticle; 10, the reticle having a pattern to be transferred; 11, an outer barrel supporting the reticle 10 and the alignment scope 9; 12, a projection lens which reduces and projects the pattern of the reticle 10 on the sensitized substrate; 13, a mirror-barrel surface plate supporting the projection lens 12, the illumination system 8 and the outer barrel 11; 14, the sensitized substrate; 15, an X-stage, supporting the sensitized substrate 14, capable of moving in an x-direction; 16, a Y-stage, supporting the X-stage 15, capable of moving in a y-direction; 17, a stage surface plate supporting the Y-stage 16; and 18, a base surface plate supporting the mirror-barrel surface plate 13 and the stage surface plate 17.

Note that the posture or relative position of the exposure apparatus with respect to the mounting floor is represented as six degrees of freedom (in x-, y- and z-directions, and a rotational direction around x-, y- and z-axes), regarding the constituting elements supported by the base surface plate 18 as one rigid body. Numeral 19 denotes a vibration damping apparatus supporting the base surface plate 18. The vibration damping apparatus 19 has four units respectively fixed at the four corners of the base surface plate 18 and connected to each other by a frame, as characteristic elements of the present embodiment.

Numeral 20 denotes a controller which controls the overall operation of the exposure apparatus; 21, a vibration-damping controller which mainly controls the operation of the vibration damping apparatus 19; and 22, a driver which drives actuators of the respective four units of the vibration damping apparatus 19.

Next, the operation of the exposure apparatus will be described. When the sensitized substrate 14 is conveyed by a sensitized-substrate conveyance system (not shown) onto the X- and Y-stages 15 and 16, the controller 20 outputs a stage-drive signal to step-move the sensitized substrate 14 to the position to be exposed. The X- and/or Y-stage step-moves in accordance with the stage-drive signal. After the step motion, the alignment scope 9 performs final position measurement, and through feedback-control based on a position signal from the alignment scope 9, the positioning of the X- and Y-stages is completed. When the positioning has been completed, the controller 20 outputs an emission instruction to a light-source device as a laser light source to emit laser light. Laser light emitted from the light source is irradiated upon the sensitized substrate 14 via the illumination system 8, the reticle 10 and the projection lens 12 of the exposure apparatus, thereby the sensitized substrate 14 is exposed.

Next, the vibration damping apparatus 19 of the exposure apparatus in FIG. 2 will be described with reference to FIGS. 1 and 3. As shown in FIG. 3, the respective units of the active vibration-damping apparatus 19 are set on a base or a mounting floor. The units support the exposure apparatus on the base surface plate 18 by air springs 4 (41–44). The units respectively have an acceleration sensor 6 for detecting vibration of the exposure apparatus and a displacement sensor 5 for detecting the relative position of the exposure apparatus with respect to the mounting floor. The vibration-damping controller 21 processes detection signals from the acceleration sensor 6 and the displacement sensor 5, and generates control signals. Numeral 7 denotes a servo valve which supplies/exhausts air to/from the air spring 4 based on the control signal. The servo valve 7 is provided with compressed air from an air-pressure source such as a compressor.

FIG. 1 shows the arrangement of the respective units of the active vibration-damping apparatus 19. The units supporting the exposure apparatus in a vertical direction are provided at the four corners of the exposure apparatus (base surface plate 18). The units respectively have the air spring 4, and the acceleration sensor 6, the displacement sensor 5 and the servo valve 7, provided for the air spring 4. Further, a communicating pipe 2, connecting the third and fourth air springs 43 and 44, is provided between the third and fourth air springs 43 and 44, and a variable air valve 3 for controlling the amount of air that flows through the communicating pipe 2, is provided on the communicating pipe 2.

When the exposure apparatus is at the static reference position with respect to the mounting floor, as the X- and Y-stages 15 and 16 move rightward in FIG. 1, the first and fourth air springs 41 and 44 of the active vibration-damping apparatus sink, and the inner air pressures of these air springs increase. On the other hand, the second and third air springs 42 and 43 rise, and the inner air pressures of these air springs decrease. At this time, the acceleration sensors 6 and the displacement sensors 5 monitor vibration of the exposure apparatus and the relative position of the apparatus with respect to the mounting floor. The vibration-damping controller 21 processes detection signals from the sensors 5 and 6, and outputs control signals to the servo valves 7 of the first to fourth air springs 41 to 44. The servo valves 7 operate based on the control signals, to exhaust air from the second and third air springs 42 and 43, while supplying air into the first and fourth air springs 41 and 44, thus restoring the initial posture of the exposure apparatus. At this time, the air in the third air spring 43 and that in the fourth air spring 44 flow through the communicating pipe 2 such that these air springs have the same inner air pressure. After a predetermined period has elapsed since the exposure apparatus has stopped at the static reference position with respect to the mounting floor, the third and fourth air springs 43 and 44 have the same inner pressure. This period can be controlled by the variable air valve 3.

As described above, according to the present embodiment, the displacement and acceleration of the base surface plate 18, caused by motion of the X- and Y-stages 15 and 16, are detected by the displacement sensors 5 and the acceleration sensors 6. The vibration-damping controller 21 damps the vibration of the base surface plate 18, and controls the air springs 41 to 44 via the driver 22 so as to stop the base surface plate 18 at the static reference position, based on detection signals from the sensors.

Regarding the third and fourth air springs 43 and 44 connected via the communicating pipe 2, it takes a predetermined period to reach equal inner pressures at both air springs. Accordingly, upon damping the vibration of the base surface plate 18, the air springs 41 to 44 independently function as four air springs, thus performing effective vibration damping.

Further, as the third and fourth air springs 43 and 44 are connected via the communicating pipe 2, these air springs finally have the same inner pressure. Then the third and fourth air springs 43 and 44 function as one air spring. As a result, the base surface plate 18 is supported by substantially three air springs. This prevents deformation of the base surface plate 18 when it stays at the static reference position.

Note that in the above embodiment, the servo valve 7 is provided at the first to fourth air springs 41 to 44; however, it may be arranged such that one of the servo valves 7 to be provided at the third and fourth air springs is omitted, since the third and fourth air springs are connected via the communicating pipe 2. Accordingly, the number of servo valves 7 can be reduced. Thus, simplification of the structure of the apparatus and reduction of costs can be attained. In this case, however, air is supplied from only one of these air springs, and the speed of response to the vibration and the like is lowered a little.

Note that it is apparent, to those skilled in the art, that the servo valve 7 can be replaced with other electricity/air-pressure converters such as an electromagnetic valve.

Further, the air to control the inner pressures of the air springs can be replaced with various gasses such as helium gas.

As described above, according to the above embodiment, in a vibration damping apparatus and method which damps vibration from a mounting floor to an upper apparatus and vibration of the upper apparatus due to step motions of the X- and Y-stage and the like, and restores the initial relative position of the upper apparatus with respect to the mounting floor with high precision, as one or more couples of air springs among four or more air springs are connected with each other, the equilibrium of inner pressures of the air spring in accordance with stepped positions of the X- and Y-stage can be restored with high precision. Accordingly, the alignment ability of the exposure apparatus can be improved.

As many apparently widely different embodiments of the present invention can be made without departing from the spirit and scope thereof, it is to be understood that the invention is not limited to the specific embodiments thereof except as defined in the appended claims.

What is claimed is:

1. A vibration damping apparatus, provided between an upper apparatus and a mounting floor, supporting the upper apparatus, said vibration damping apparatus comprising:

at least four air springs for supporting the upper apparatus;

pressure control means for controlling air pressures of said air springs by changing amounts of air in said air springs, so as to dampen vibration from the mounting floor to the upper apparatus, and suppress vibration of the upper apparatus; and air communicating means for mutually passing air between at least one couple of the air springs among said air springs, said air communicating means comprising an air valve, positioned in a path of the air flow in said air communicating means, for controlling air flow through said air communicating means, whereby the difference of the air pressure between said at least one couple of the air springs is equalized by passing air through said air communicating means by the opening of said air valve, thereby creating an equilibrium of air pressures between said at least one couple of air springs.

2. The vibration damping apparatus according to claim 1, wherein said air communicating means comprises a pipe for passing the air, and said air valve comprises a variable air valve for controlling the amount of air that flows through said pipe.

3. The vibration damping apparatus according to claim 1, wherein said pressure control means comprises:

monitor means for monitoring at least one of displacement, speed and acceleration of the upper apparatus, and air pressures within said air springs;

electricity/air-pressure converting means for controlling the air pressures within said air springs; and control means for driving said electricity/air-pressure converting means in accordance with output signals from said monitoring means.

4. The vibration damping apparatus according to claim 1, wherein, if a couple of the air springs among said air springs, connected by said air communicating means, us regarded as one air spring, the number of said air springs is three.

5. The vibration damping apparatus according to claim 1, wherein, with regard to a couple of the air springs among said air springs, connected by said air communicating means, said pressure control means controls air pressure of at least one of the couple of air springs.

6. An exposure apparatus comprising:

at least four air springs, provided on a mounting floor, for supporting said exposure apparatus;

pressure control means for controlling air pressures of said air springs by changing amounts of air in said air springs, so as to dampen vibration from the mounting floor to said exposure apparatus, and suppress vibration of said exposure apparatus;

air communicating means for mutually passing air between at least one couple of the air springs among said air springs, said air communicating means comprising an air valve, positioned in a path of the air flow in said air communicating means, for controlling air flow through said air communicating means; and exposure means, mounted on said exposure apparatus, for projection-exposing a reticle pattern via a projection optical system onto a sensitized substrate, by a step-and-repeat method, whereby the difference of the air pressure between said at least one couple of the air springs is equalized by passing air through said air communicating means by the opening of said air valve, thereby creating an equilibrium of air pressures between said at least one couple of air springs.

7. The exposure apparatus according to claim 6, wherein said air communicating means comprises a pipe for passing the air, and said air valve comprises a variable air valve for controlling the amount of air that flows through said pipe.

8. The exposure apparatus according to claim 6, wherein said pressure control means comprises:

monitor means for monitoring at least one of displacement, speed and acceleration of said exposure apparatus, and air pressures within said air springs;

electricity/air-pressure converting means for controlling the air pressures within said air springs; and control means for driving said electricity/air-pressure converting means in accordance with output signals from said monitoring means.

9. The exposure apparatus according to claim 6, wherein, if a couple of the air springs among said air springs, connected by said air communicating means, us regarded as one air spring, the number of said air springs is three.

10. The exposure apparatus according to claim 6, wherein, with regard to a couple of the air springs among said air springs, connected by said air communicating means, said pressure control means controls air pressure of at least one of the couple of air springs.

11. A control method for a vibration damping apparatus, provided between an upper apparatus and a mounting floor, supporting the upper apparatus with at least four air springs, said method comprising:

a damping step of controlling air pressures of the air springs based on at least one of displacement, speed, and acceleration of the upper apparatus and air pressures within the air springs so as to dampen vibration of the upper apparatus; and a pressure-difference eliminating step of eliminating an air-pressure difference between at least one couple of air springs among the air springs, caused by said damping step, said pressure-difference eliminating step comprising controlling air flow between at least one couple of the air springs using an air valve in air communicating means, the air valve being positioned in the air flow paths, whereby the difference of the air pressure between the at least one couple of the air springs is equalized by passing air through the air communicating means by the opening of the air valve, thereby creating an equilibrium of air pressures between the at least one couple of air springs.

12. A control method according to claim 11, further comprising controlling a response time in said pressure-difference eliminating step by the air valve.

13. A device manufacturing method by using an exposure apparatus supported by at least four air springs on a mounting floor, said method comprising:

a projection-exposure step of driving stages of the exposure apparatus, and projection-exposing a reticle pattern via a projection optical system onto a sensitized substrate, by a step-and-repeat method;

an air-pressure control step of suppressing vibration caused by driving of the stages of the exposure apparatus, and controlling air pressures of the air springs so as to dampen vibration from the mounting floor to the exposure apparatus; and a pressure-difference eliminating step of eliminating an air-pressure difference between at least one couple of the air springs among the air springs, caused by said air-pressure control step, said pressure-difference eliminating step comprising controlling air flow between at least one couple of the air springs using an air valve in air communicating means, the air valve being positioned in the air flow path, whereby the difference of the air pressure between the at least one couple of the air springs is equalized by passing air through the air communicating means by the opening of the air valve, thereby creating an equilibrium of air pressures between the at least one couple of air springs.

14. The device manufacturing method according to claim 13, further comprising controlling a response time in said pressure-difference eliminating step by the air valve.

* * * * *

UNITED STATES PATENT AND TRADEMARK OFFICE
CERTIFICATE OF CORRECTION

PATENT NO. : 5,881,987

DATED : March 16, 1999

INVENTOR(S): HIROMICHI HARA

It is certified that error appears in the above-identified patent and that said Letters Patent is hereby corrected as shown below:

COLUMN 2:

line 65, "to" should be deleted; and
    line 66, "pressure" should read --pressures of--.

COLUMN 4:

line 59, "sink" should read --sinks--; and
    line 63, "into-the" should read --into the--.

COLUMN 5:

line 3, "form" should read --from--.

COLUMN 7:

line 16, "Then" should read --Then,--; and
    line 42, "Y-stage" should read --Y-stages--.

COLUMN 8:

line 28, "us" should read --is--.

UNITED STATES PATENT AND TRADEMARK OFFICE
CERTIFICATE OF CORRECTION

PATENT NO. : 5,881,987

DATED : March 16, 1999

INVENTOR(S) : HIROMICHI HARA

It is certified that error appears in the above-identified patent and that said Letters Patent is hereby corrected as shown below:

COLUMN 9:

line 8, "us" should read --is--.

Signed and Sealed this

Nineteenth Day of October, 1999

Attest:

Q. TODD DICKINSON

*Attesting Officer*      *Acting Commissioner of Patents and Trademarks*